United States Patent
Bauerle et al.

(10) Patent No.: US 12,206,039 B2
(45) Date of Patent: Jan. 21, 2025

(54) THREE-DIMENSIONAL PHOTOCONDUCTIVE TRANSDUCER FOR TERAHERTZ SIGNALS OR PICOSECOND ELECTRICAL PULSES

(71) Applicants: CENTRE NATIONAL DE LA RECHERCHE SCIENTIFIQUE, Paris (FR); INSTITUT POLYTECHNIQUE DE GRENOBLE, Grenoble (FR); UNIVERSITE SAVOIE MONT BLANC, Chambèry (FR); UNIVERSITE GRENOBLE ALPES, Saint-Martin-d'Yères (FR)

(72) Inventors: Christopher Bauerle, Grenoble (FR); Jean-François Roux, Le Bourget du Lac (FR); Giorgos Georgiou, Grenoble (FR)

(73) Assignees: CENTRE NATIONAL DE LA RECHERCHE SCIENTIFIQUE, Paris (FR); INSTITUT POLYTECHNIQUE DE GRENOBLE, Grenoble (FR); UNIVERSITE SAVOIE MONT BLANC, Chambèry (FR); UNIVERSITE GRENOBLE ALPES, Saint-Martin-d'Yères (FR)

( * ) Notice: Subject to any disclaimer, the term of this patent is extended or adjusted under 35 U.S.C. 154(b) by 225 days.

(21) Appl. No.: 17/782,987

(22) PCT Filed: Dec. 10, 2020

(86) PCT No.: PCT/EP2020/085625
§ 371 (c)(1),
(2) Date: Jun. 6, 2022

(87) PCT Pub. No.: WO2021/116339
PCT Pub. Date: Jun. 17, 2021

(65) Prior Publication Data
US 2023/0026900 A1    Jan. 26, 2023

(30) Foreign Application Priority Data

Dec. 13, 2019  (EP) .................................. 19306646

(51) Int. Cl.
| | | |
|---|---|---|
| *H01L 31/12* | (2006.01) | |
| *H01L 31/0224* | (2006.01) | |
| *H01L 31/0304* | (2006.01) | |
| *H01L 31/0384* | (2006.01) | |
| *H01L 31/18* | (2006.01) | |

(52) U.S. Cl.
CPC .... *H01L 31/125* (2013.01); *H01L 31/022475* (2013.01); *H01L 31/0304* (2013.01);
(Continued)

(58) Field of Classification Search
None
See application file for complete search history.

(56) References Cited

U.S. PATENT DOCUMENTS

| | | | |
|---|---|---|---|
| 11,749,694 B1 * | 9/2023 | Brener .................. | H01Q 9/285 |
| | | | 257/448 |
| 2004/0075464 A1 | 4/2004 | Samuelson et al. | |

(Continued)

FOREIGN PATENT DOCUMENTS

| | | |
|---|---|---|
| CN | 108 417 976 A | 8/2018 |
| FR | 2 949 905 A1 | 3/2011 |

(Continued)

OTHER PUBLICATIONS

Yardimci, et al., "High-Power Terahertz Generation Using Large-Area Plasmonic Photoconductive Emitters", IEEE Transactions on Terahertz Science and Technology, vol. 5, N° 2, pp. 223-229, Mar. 2015.
(Continued)

*Primary Examiner* — Marcus H Taningco
(74) *Attorney, Agent, or Firm* — Maier & Maier, PLLC

(57) ABSTRACT

A photoconductive transducer intended to generate or detect waves in the terahertz frequency domain or in the picosec-
(Continued)

ond pulse domain is provided. The transducer comprises a three-dimensional structure that includes, in this order, a first planar electrode, an array of nano-columns embedded in a layer of resist and a second planar electrode parallel to the first planar electrode. The design of the transducer increases the optical-to-terahertz conversion efficiency by means of photonic and plasmonic resonances and by means of high and homogeneous electric fields. The height of the nano-columns as well as the thickness of the resist range between 100 nanometres and 400 nanometres. The width of the nano-columns is between 100 nanometres and 400 nanometres, the distance between two adjacent nano-columns is between 300 nanometres and 500 nanometres, the nano-columns are made of a III-V semiconductor. The second electrode is transparent, so as to allow the transmission of a laser source towards the photo-absorbing nano-columns.

10 Claims, 3 Drawing Sheets

(52) U.S. Cl.
CPC ........ *H01L 31/0384* (2013.01); *H01L 31/184* (2013.01); *H01L 31/1884* (2013.01)

(56) References Cited

U.S. PATENT DOCUMENTS

| | | | |
|---|---|---|---|
| 2008/0000525 A1* | 1/2008 | Shimura | B82Y 10/00 136/256 |
| 2010/0276670 A1* | 11/2010 | Shen | H10K 30/353 257/E51.027 |
| 2012/0256091 A1* | 10/2012 | Nakahashi | A61B 6/102 250/361 R |
| 2014/0175283 A1 | 6/2014 | Vassant et al. | |
| 2014/0175546 A1 | 6/2014 | Huffaker et al. | |
| 2020/0264048 A1* | 8/2020 | Jarrahi | G01J 3/108 |

FOREIGN PATENT DOCUMENTS

| | | |
|---|---|---|
| JP | 2005532181 A | 10/2005 |
| WO | 2013/112608 A1 | 8/2013 |

OTHER PUBLICATIONS

Yang, et al., "7.5% Optical-to-Terahertz Conversion Efficiency Offered by Photoconductive Emitters With Three-Dimensional Plasmonic Contact Electrodes", IEEE Transactions on Terahertz Science and Technology, vol. 4, N° 5, pp. 575-581, Sep. 2014.

Yardimci, et al., "A High-Power Broadband Terahertz Source Enabled by Three-Dimensional Light Confinement in a Plasmonic Nanocavity", Scientific Reports, 7(1), pp. 4166, 2017.

Burford, et al., "Computational modeling of plasmonic thin-film terahertz photoconductive antennas", Journal of the Optical Society of America B, 33(4), pp. 748-759, 2016.

Peytavit, et al., "Low-Temperature-Grown GaAs Photoconductor with High Dynamic Responsivity in the Millimeter Wave Range", Applied Physics Express, 4, 104101, 2011.

\* cited by examiner

[Fig. 1]
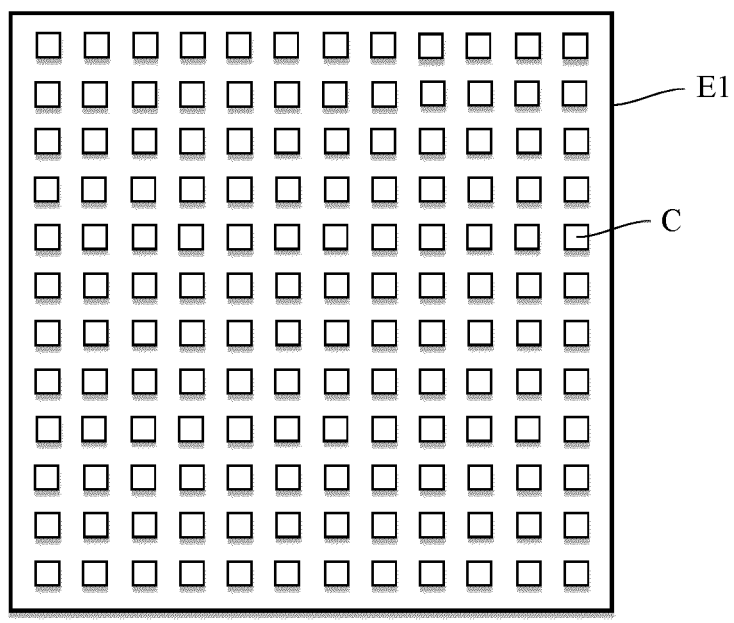
[Fig. 2]
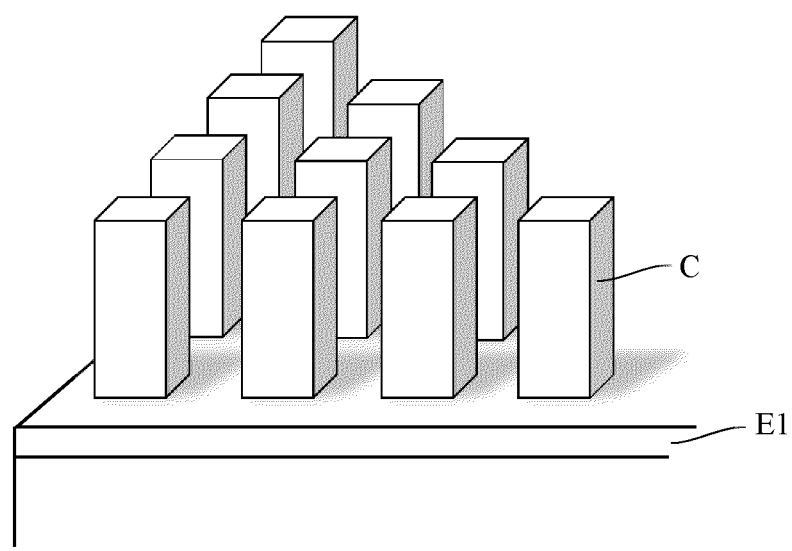

[Fig. 3]
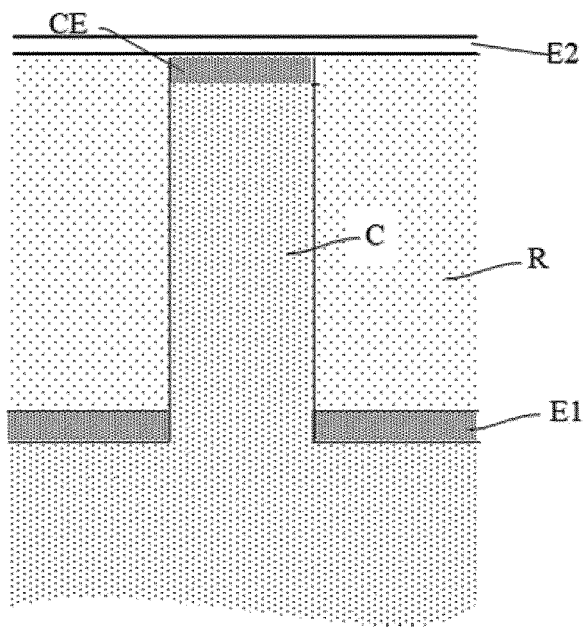
[Fig. 4]
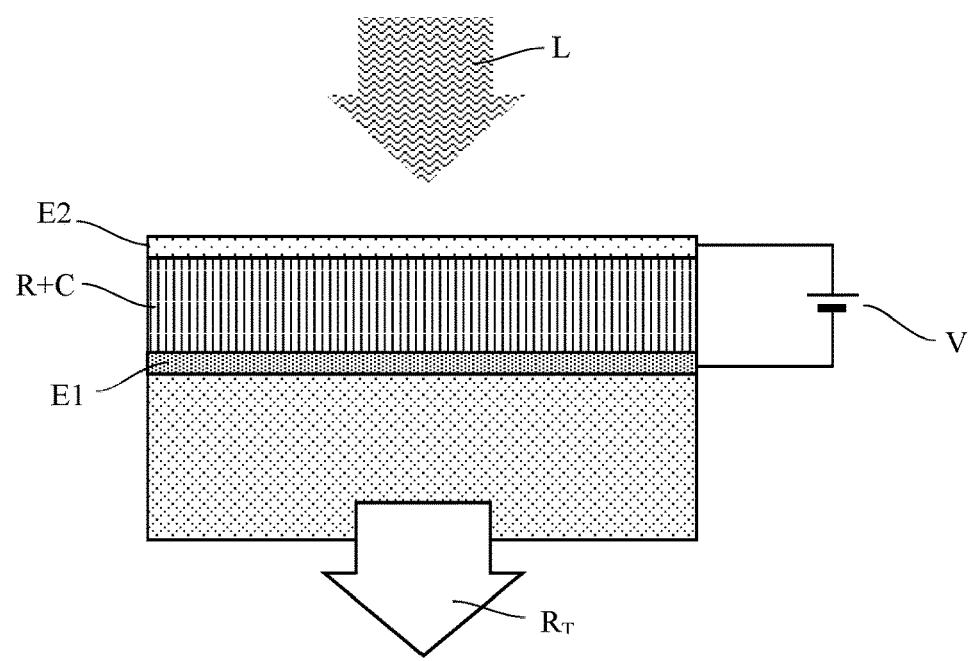

[Fig. 5]
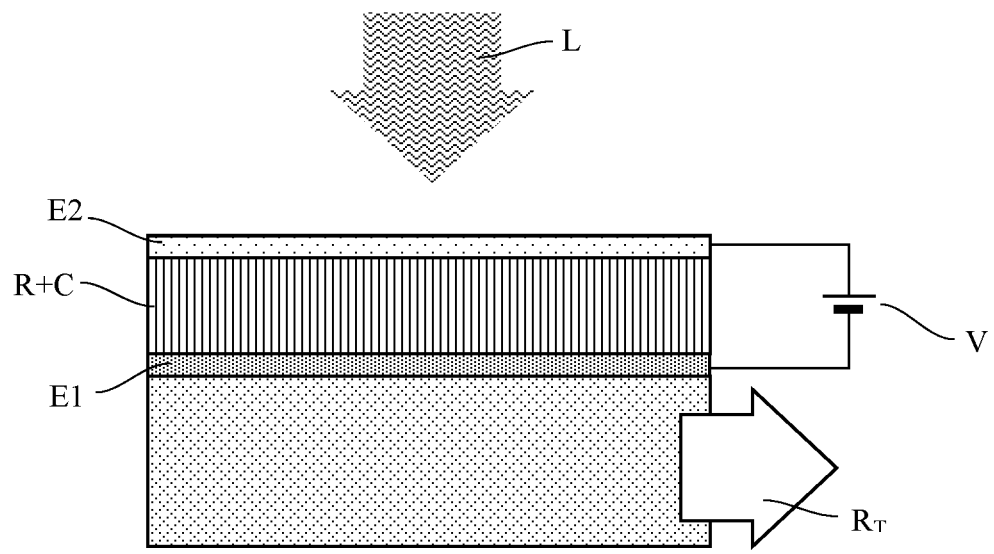
[Fig. 6]
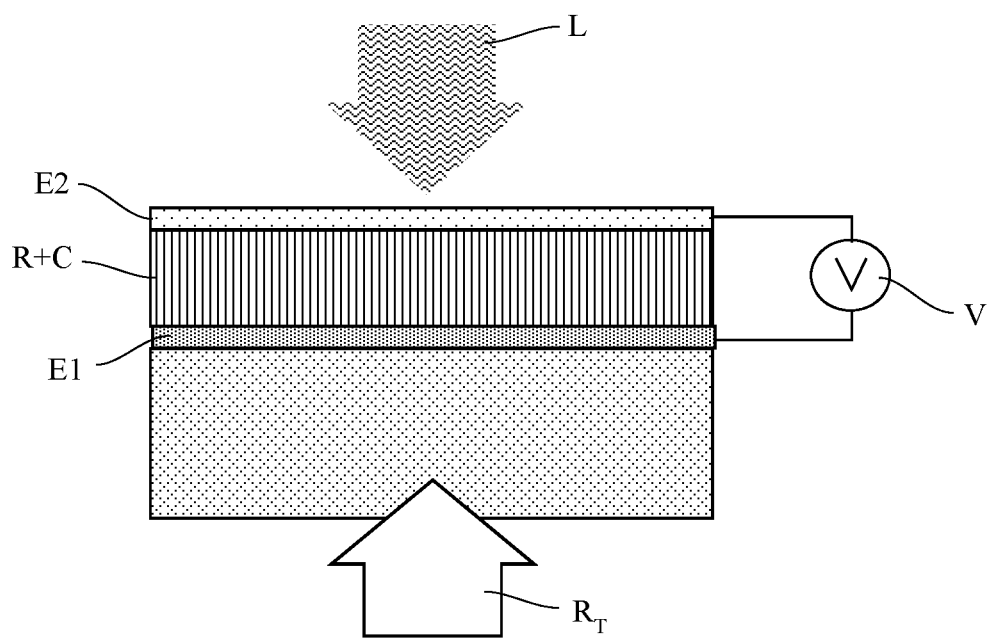

THREE-DIMENSIONAL PHOTOCONDUCTIVE TRANSDUCER FOR TERAHERTZ SIGNALS OR PICOSECOND ELECTRICAL PULSES

CROSS-REFERENCE TO RELATED APPLICATIONS

This application is a National Stage of International patent application PCT/EP2020/085625, filed on Dec. 10, 2020, which claims priority to foreign European patent application No. EP 19306646.1, filed on Dec. 13, 2019, the disclosures of which are incorporated by reference in their entirety.

FIELD OF THE INVENTION

The field of the invention is the field of sources for generating or for detecting radiation at very high frequencies and/or electrical pulses of very short durations, of the order of a picosecond or shorter than a picosecond. One of the preferred applications of the invention is the development of high-efficiency terahertz sources.

Terahertz radiation has various fields of application that are particularly related to its high penetration power into most materials. For example, the fields of application for this invention may be security, detection, quality control, communications and electronic applications employing nano-technologies. It is possible to use these sources at room temperature or at cryogenic temperatures.

Developing this highly-efficient terahertz source is one of the encountered difficulties. One possible production technique involves converting optical radiation generated by a continuous-wave or pulsed laser into terahertz radiation and/or electrical pulses. Various transducing means are possible.

One of the most common means is to employ an opto-electronic device, known as a photoconductive switch. The latter may generate continuous-wave terahertz radiation or picosecond electrical pulses via the following mechanism.

A laser source emits a continuous-wave radiation or radiation in the form of ultra-short pulses. The so-called ultra-short refers to pulses with time duration smaller than 100 femtosecond. The radiation provided by the laser source is located in the visible or in the near infrared region of the electromagnetic spectrum. The light provided by the laser source is absorbed by a semiconducting material, such as gallium arsenide (GaAs) or indium gallium arsenide (InGaAs). By means of optical absorption, charge carriers are generated in the semiconductor and subsequently collected by metal contacts herein called electrodes, thus creating an electrical signal. Herein, the process of charge carrier generation by means of optical absorption will be referred to as photo-generation.

The temporal duration and frequency of this signal depend on the frequency and duration of the light provided by the laser source. The very high dynamic range of the optoelectronic device allows electrical signals to be generated in the gigahertz or terahertz frequency bands.

The main drawback of the existing technology is its low conversion efficiency, which makes it unsuitable for applications that require a certain terahertz power or for systems and applications that are required to operate in a cryogenic environment.

The conversion efficiency is defined as the ratio between the optical power delivered by the laser source and the terahertz power delivered by the optoelectronic device. This efficiency is the product of two factors. The first factor is related with the absorption efficiency of the laser light by the semiconductor. The absorption efficiency is generally low.

The second factor is related to the collection efficiency of the photo-generated charge carriers by the electrodes of the optoelectronic device. This efficiency is also low. A certain number of technical solutions for improving these two factors have been proposed.

The publication by Nezih T. Yardimci et al. entitled "High-Power Terahertz Generation Using Large-Area Plasmonic Photoconductive Emitters" published in IEEE Transactions on Terahertz Science and Technology, Vol. 5, No 2, March 2015 pp. 223-229 and patent application WO2013/112608 entitled "Photoconductive device with plasmonic electrodes", describe a photoconductive device comprising the following components. A semiconductor substrate, an antenna assembly and a photoconductive assembly that is made out of one or more plasmonic contact electrodes positioned on the semiconductor substrate. This photoconductive assembly is made such as to improve the overall efficiency of the photoconductor device by increasing the laser absorption efficiency in the photo-absorbing regions of the semiconductor substrate through plasmonic resonances. This device only improves the laser absorption efficiency.

The publication by Shang-Hua Yang et al. entitled "7.5% Optical-to-Terahertz Conversion Efficiency Offered by Photoconductive Emitters With Three-Dimensional Plasmonic Contact Electrodes", published in IEEE Transactions on Terahertz Science and Technology, Vol. 4, No 5, September 2014 pp. 575-581 proposes a similar photoconductive device comprising an array composed of parallel rows of plasmonic contact electrodes.

The publication by Nezih Tolga Yardimci et al. entitled "A High-Power Broadband Terahertz Source Enabled by Three-Dimensional Light Confinement in a Plasmonic Nanocavity" published in Scientific Reports, 7(1), pp. 4166 describes a device similar to the preceding ones but it comprises an additional distributed Bragg reflector as part of the photo-absorbing semiconductor to facilitate further increase of the laser absorption.

The publication by Burford et al. entitled "Computational modeling of plasmonic thin-film terahertz photoconductive antennas" published in the Journal of the Optical Society of America B, 33(4), pp. 748-759 describes a photoconductive device comprising a thin plasmonic array of nanodiscs placed on the contact electrodes.

The publication by Peytavit et al. entitled "Low-Temperature-Grown GaAs Photoconductor with High Dynamic Responsivity in the Millimeter Wave Range" published in Applied Physics Express 4 (2011) 104101 and French patent application FR 2 949 905 by the same inventor and entitled "*Photodétecteur, photomélangeur et leur application à la génération de rayonnement térahertz*" ("Photodetector, photomixer and application thereof to generate terahertz radiation") describe a photodetector that comprises a layer of photoconductive material capable of absorbing optical laser radiation. The so-called thin layer, has a thickness that is smaller than the absorption length of the laser radiation inside the photo-absorbing material. The photo-absorbing material is positioned between two electrodes. An electrode, called the upper electrode, which is at least partially transparent, and an electrode, called the lower electrode, which is reflective. The so-called lower and upper electrodes form a resonant cavity for the laser radiation. This photodetector is coupled to an antenna for generating free space terahertz radiation. This device, unlike the devices described above, allows the conversion efficiency to be increased, by increasing the collection efficiency of the charge carriers by the metal electrodes.

US 2014/175283 discloses a terahertz detector comprising a one- or two-dimensional array of slabs made of a polar semi-conductor in a dielectric matrix. On each face of a slab, the interface with the dielectric matrix supports an interface phonon polariton. Each slab has an upper and a lower electric contact and forms an optical antenna, enabling the resonant coupling of the interface phonon polariton and an incident radiation.

None of these publications allows for both, high laser absorption efficiency and a satisfactory collection efficiency of the generated carriers to be achieved. One aim of the invention is to significantly improve these two efficiencies using a single and simple structure that combines the advantages of a parallel-electrode device and of plasmonic/photonic structures.

More precisely, one subject of the invention is a photoconductive transducer intended to generate or to detect waves and signals in the terahertz frequency domain or in the picosecond pulse domain, according to claim 1.

Dependent claims 2 to 7 correspond to specific embodiments of such a photoconductive transducer.

The invention also relates to a Terahertz emitter according to claim 8, comprising such a photoconductive transducer.

The invention also relates to the use of such a photoconductive transducer for emitting and/or detecting waves in the terahertz frequency domain.

The invention also relates to a process according to claim 10 for producing such a photoconductive transducer.

Other features, details and advantages of the invention will become apparent upon reading the description, which is given with reference to the appended drawings, which are given by way of example and show, respectively:

FIG. 1 an illustration of a top view of the structure of a photoconductive transducer according to the invention;

FIG. 2 an illustration of a partial perspective view of the nano-columns comprising the photoconductive transducer according to the invention;

FIG. 3 an illustration of a cross-sectional view of a nano-column according to the invention;

FIG. 4 an illustration of a first embodiment of the photoconductive transducer, employed as a source of terahertz radiation;

FIG. 5 an illustration of a second embodiment of the photoconductive transducer, employed as a source of terahertz radiation;

FIG. 6 an illustration of a third embodiment of the photoconductive transducer, employed as a receiver of terahertz radiation.

The photoconductive transducer, according to the invention, may operate either as an emitter or as a receiver of waves in the terahertz frequency domain or in the picosecond pulse domain. Excluding a few details, the structure used for these two applications is the same.

The photoconductive transducer, according to the invention, may also operate as a source for THz frequency waves or electrical signals with picosecond time duration for micro- or nano-electronic circuits.

The core of the transducer comprises a structure including, in this order, the following three elements:
a first planar electrode,
a layer of resist comprising—an embedded array of identical nano-columns placed perpendicular to the plane defined by the first electrode. The distances between two adjacent columns is constant,
a second planar electrode parallel to the first planar electrode.

The area of the structure is between 1 $\mu m^2$ and 1000 $\mu m^2$, depending on the use of the transducer.

FIG. 1 shows a top view of the nano-column array C placed on top of the first electrode E1. FIG. 2 shows a partial perspective view of the nano-columns C of the photoconductive transducer according to the invention. In the case of FIG. 2, the columns are of rectangular cross section. The cross section of the columns may also be circular or polygonal.

When the transducer is used as an emitter, it is used in combination with a laser source that emits at a defined wavelength. This wavelength is generally located in the visible or in the near infrared region of the electromagnetic spectrum. In this case, certain characteristics of the structure depend on this wavelength.

The first electrode is formed by a conductive deposit that may be made of gold or titanium or silver or aluminum.

The second electrode E2 must be transparent at the aforementioned wavelength so as to let the incident laser radiation penetrate into the structure. To this end, the second electrode may be formed by depositing a layer of indium-tin oxide, which is transparent for wavelengths larger than 300 nanometres.

The thickness of the second electrode E2 is specific to the aforementioned wavelength and must be such that it forms an anti-reflection coating for the particular wavelength.

In the same way, the resist R must also be transparent at the wavelength of the laser source. For example, it is possible to use a negative photoresist, such as the resist known as SU-8, which is commonly used in the fabrication of micro-systems of this type and of which there are various variants. Other types of transparent resists are, of course, possible. The layer of resist generally has a thickness comprised between 100 nanometres and 400 nanometres.

The height of the nano-columns is equal to the height of the layer of resist. The width of the columns and the distance separating two adjacent columns are adapted to the wavelength of the laser and to the refractive index of the resist.

By optimizing the spatial dimensions of the nano-columns with respect to the spatial dimension of the laser wavelength, the absorption of the laser light is maximized, with this being the desired aim. The length and width of each nano-column are such that the laser is absorbed by excitation of plasmonic resonances at the upper and lower surfaces of the structure. In addition, guided optical photonic modes, which propagate through the heterogeneous layer consisting of the polymer resist and of the array of nano-columns, will also be excited. Furthermore, a resonant cavity mode will also be excited inside the nano-column and in the vertical direction between the two electrodes. Generally, the width of the columns is in the range between 100 nanometres and 400 nanometres.

The pitch of the array of the nano-columns, which corresponds to the distance between two successive columns, is responsible for the excitation of collective photonic resonances described above. This is due to the periodic arrangement of the nano-columns which diffract efficiently the laser light into the interior of the heterogeneous layer. The distance between two columns is between 300 nanometres and 500 nanometres. By combining plasmonic and photonic effects, it is possible to obtain an absorption higher than 95%.

The material of the columns must be optimized to obtain the best possible picosecond pulse. Materials with very fast carrier response times, i.e. with very fast carrier dynamics, must therefore be used. To give an order of magnitude, it is preferable for this time to be shorter than 10 picoseconds. For example, the nano-columns can be made of specially treated III-V semiconductors such as gallium arsenide or gallium indium arsenide or indium phosphide.

Each column C bears a contact on the top end that is made of a conductive material that is identical to that of the first electrode and that ensures electrical continuity with the transparent second electrode.

FIG. 3 shows a cross-sectional view of a nano-column C according to the invention. It is encircled by a resist R. It comprises—an electrical contact CE. The resist R is situated between the two electrodes E1 and E2.

FIG. 4 shows the photoconductive transducer according to the invention operating as a source of terahertz radiation. It comprises—a laser L, which has been represented symbolically by a solid arrow, emitting at a defined wavelength, the second electrode E2 being transparent at the aforementioned wavelength. The laser is arranged so as to irradiate, through the second electrode E2, the array of nano-columns C, which are embedded in the resist R, with the aforementioned array being referenced by R+C in FIG. 4.

The arrangement of the structure with the conversion medium being composed of the resist layer and the array of nano-columns placed between the two planar and parallel electrodes, allows for the creation of a uniform electric field by subjecting the two electrodes, E1 and E2, to a potential difference V of a few volts.

Because of the very small distance separating the two electrodes, this potential difference is capable of creating very strong electric fields. The order of magnitude of these fields is of 100 kV/cm. Depending on the application, the applied voltages are DC or AC.

The created electric field accelerates uniformly the charge carriers generated by the absorption of the laser radiation. The uniform electric field allows the number of carriers collected by the electrodes to be maximized and thus the generated signal to be increased. It is therefore essential for the height of the pillars to be small such that the distance travelled by these carriers is minimized. Minimum travelled distance ensures that the carriers are not lost through recombination mechanisms.

The transducer generates terahertz radiation or picosecond electrical signals $R_T$. The aforementioned $R_T$ can be converted to a free space terahertz radiation through the aid of an antenna element or guided through waveguide elements towards micro- and nano-electronic circuits as shown in FIG. 5. The references of FIG. 5 are identical to those of FIG. 4. The duration, the intensity and the frequency bandwidth generated, depend on the duration of the laser source, on its power, on its wavelength and on the potential difference V applied between the electrodes E1 and E2.

FIG. 6 shows the photoconductive transducer according to the invention operating as a detector of terahertz radiation. The terahertz radiation accelerates the electrons, which flow between the two electrodes E1 and E2.

For example, the process for producing the transducer structure, according to the invention, comprises of the steps described below.

Step 1: etching the array of columns in a substrate made of III-V semiconductors such as gallium arsenide or indium-gallium arsenide or indium phosphide;

Step 2: depositing a metal layer on the upper surface of the columns and on the lower surface of the substrate that bears the columns. The metal layers will constitute the metal contacts. This operation may be carried out at low pressure, i.e. at a pressure below $10^{-6}$ millibars and with a slow evaporation rate, the order of magnitude of the evaporation rate being 0.5 nm/s. The deposited metal may be made of gold or silver or aluminum or titanium. It is essential, in this operation, that there is no contact between the bottom metal layer, which serves as first electrode, and the metal layer on the upper surface of the nano-columns, which connects to the second electrode;

Step 3: spin coating a layer of negative epoxy photoresist such as SU-8 and cover completely the array of nano-columns. The deposited thickness can be for homogeneity three times larger than the height of the nano-columns;

Step 4: exposing the layer of resist with an electron beam or UV lithography;

Step 5: polishing or etching the layer of resist until the metal contacts at the top of the nano-columns appear;

Step 6: depositing a transparent metal layer on the layer of resist so as to connect the various metal contacts. This layer may be made of indium-tin oxide. The thickness of the latter layer is in the range between 100 nanometers and 300 nanometers, depending on the wavelength of the laser source.

The following are the main advantages of the photoconductive transducer according to the invention:

Its three-dimensional structure allows high efficiencies to be obtained, much higher than those obtained with prior-art devices. An improvement of a factor of 10 in efficiency is thus obtained over current transducers.

Moreover, its "vertical" structure composed of the array of nano-columns sandwiched between two electrodes allows this efficiency to be further optimized.

Another advantage is that the same structure may be used as a source of terahertz radiation and as a receiver of the same radiation.

The transducer can be used on-chip in micro and nano-electronic circuits.

This transducer may be employed in a wide range of applications covering the fields of security, of biological or chemical detection, of quality control, of telecommunications, of electronics and quantum electronics.

Its architecture allows it to operate at room temperature and at cryogenic temperatures for ultra-fast electronic switching applications. Thus, it is possible to use it in quantum technologies. It is possible to use it as an ultra-fast source for inspecting, triggering or driving qubits for quantum computers.

The invention claimed is:

1. A Photoconductive transducer intended to generate or detect waves in the terahertz frequency domain or in the picosecond pulse domain, wherein photoconductive transducer comprises—a three-dimensional structure that comprises a first planar electrode (E1), second planar electrode (E2) parallel to the first planar electrode, and an array of identical nano-columns (C) embedded in a layer of resist (R) situated between the first and the second planar electrodes, the resist and the second planar electrode being transparent at a given wavelength in the visible or in the near infrared region of the electromagnetic spectrum, the height of the nano-columns as well as the thickness of the resist ranging between 100 nanometres and 400 nanometres, the width of the nano-columns being between 100 nanometres and 400 nanometres, the distance between two consecutive nano-columns being between 300 nanometres and 500 nanometres, the nano-columns made of a III-V semiconductor and the top part of each nano-column comprising a metal contact (CE) that is electrically connected to the second electrode.

2. The photoconductive transducer according to claim 1, wherein the width of the columns, the distance separating two adjacent columns and the refractive index of the resist are chosen in such a way that illuminating the photoconductive transducer at the given wavelength through the second planar electrode excites: guided optical photonic modes propagating through the heterogeneous layer consisting of the polymer resist and of the array of nano-columns; plasmonic resonances at the upper and lower surfaces of the structure; and resonant cavity modes inside the nano-columns and in the vertical direction between the two electrodes.

3. The photoconductive transducer according to claim 1, wherein the area of the three-dimensional structure is comprised between 1 $\mu m^2$ and 1000 $\mu m^2$.

4. The photoconductive transducer according to claim 1, wherein the second electrode is made of indium-tin oxide.

5. The photoconductive transducer according to claim 1, wherein the cross section of the nano-columns is rectangular or circular or polygonal.

6. The photoconductive transducer according to claim 1, wherein the material of the nano-columns is a III-V semiconductor chosen among gallium arsenide or indium-gallium arsenide or indium phosphide.

7. The photoconductive transducer according to claim 1, wherein the resist is a negative epoxy photoresist.

8. A terahertz emitter comprising a photoconductive transducer according to claim 1 and a laser (L) that emits at said defined wavelength, the laser being arranged so as to irradiate the array of columns through the aforementioned second electrode, and means for establishing a potential difference between the first and second electrode.

9. A terahertz receiver comprising a photoconductive transducer according to claim 1, a laser (L) that emits at said defined wavelength, the laser being arranged so as to irradiate the array of columns through the aforementioned second electrode, and a voltmeter (V) that measure the output signal resulting from a photogenerated current resulting from irradiation from the laser and an incoming Terahertz radiation (RT).

10. Process for producing a photoconductive transducer according to claim 1, characterized by the production of the three-dimensional structure comprises the following steps:

etching the array of nano-columns (C) in a substrate made of III-V semiconductor;

depositing a metal layer (E1, CE) on the upper surface of the nano-columns and on the lower surface of the substrate that bears the nano-columns, the top of the nano-columns thus comprising of a metal contact (CE);

spin coating a layer of negative epoxy photoresist (R) to cover the aforementioned array of columns;

exposing the aforementioned layer of resist with an electron beam or UV lithography;

polishing or etching the aforementioned layer of resist until the metal contacts (CE) at the top-end of the nano-columns appear;

depositing a transparent metal layer (E2) on the layer of resist so as to connect the various metal contacts (CE).

\* \* \* \* \*